United States Patent [19]

Gagnon

[11] Patent Number: 4,532,495

[45] Date of Patent: Jul. 30, 1985

[54] SPEECH DIGITIZATION SYSTEM

[75] Inventor: Richard T. Gagnon, Rochester, Mich.

[73] Assignee: Votrax, Inc., Troy, Mich.

[21] Appl. No.: 337,626

[22] Filed: Jan. 7, 1982

Related U.S. Application Data

[60] Continuation of Ser. No. 73,119, Sep. 6, 1979, abandoned, which is a division of Ser. No. 880,996, Feb. 24, 1978, abandoned.

[51] Int. Cl.³ .............................................. H03K 13/02

[52] U.S. Cl. ................................ 340/347 DA; 375/30; 381/51

[58] Field of Search .................. 340/347 DA; 375/30; 381/51

[56] References Cited

U.S. PATENT DOCUMENTS

| | | | |
|---|---|---|---|
| 3,175,212 | 3/1965 | Miller | 340/347 DA |
| 3,705,359 | 12/1972 | Kappes | 375/30 |
| 3,806,806 | 4/1974 | Brolin | 375/30 |
| 3,872,434 | 3/1975 | Duvall | 340/347 DA X |
| 3,911,363 | 10/1975 | Patten | 375/30 |
| 3,922,606 | 11/1975 | Nordling | 375/30 |
| 3,974,498 | 8/1976 | Knier | 340/347 DA |
| 3,987,436 | 10/1976 | Candy | 340/347 DA |
| 4,100,494 | 7/1978 | Boudewijns | 375/30 |
| 4,138,667 | 2/1979 | Vogel | 340/347 DA |

OTHER PUBLICATIONS

Mo Author, "Electronics Weekly", Jul. 25, 1973, pp. 18–19.

*Primary Examiner*—C. D. Miller
*Attorney, Agent, or Firm*—Brooks & Kushman

[57] ABSTRACT

A speech digitization system including novel encoder and decoder circuits that minimizes the number of resolution bits required to produce a given level of speech quality by optimizing the information content of the digital output signal from the encoder. This is accomplished by providing a companded speech digitization system that includes an amplitude function generator which is adapted to produce an amplitude function signal that maintains substantial duty cycles on the digital output signal over the entire audio amplitude range. Included in the novel amplitude function generator is a unique bias network that serves to center the duty cycle swing of the digital output signal from the encoder around 50% where the information content of the signal is statistically maximized.

11 Claims, 5 Drawing Figures

Sample
Clock In 48KHz
Audio In
4024
14559
4042
331 or AD7520
+5V
-5V
MSB
J (MSB)
K
L
M
(+A)
R20
R21
R22
R23
R24
R25
C5
C6

178
180
182
184
R27
R28
R29
C8
186
188
R30
R31
R32
190
(+A)
+5V
331 or
AD 7520
168
170
172
174
176
160
162
164
166
72
B
(MSB)
C
D
E
Audio Output
To Bandpass
Filter

SPEECH DIGITIZATION SYSTEM

This is a continuation of application Ser. No. 73,119, filed Sept. 6, 1979, now abandoned, which is division of Ser. No. 880,996, filed Feb. 24, 1978, now abandoned.

BACKGROUND AND SUMMARY OF THE INVENTION

The present invention relates to a system for digitizing human speech and in particular to a system that provides excellent speech reproduction utilizing a minimum number of resolution bits.

In general, speech digitizers are adapted to digitize human speech by sampling an incoming speech signal at a predetermined rate and generating a parallel digital bit stream in accordance with the amplitude characteristics of the speech signal at each sample point. The digital bit stream is then either transmitted to a remote location and converted back to speech by a "de-digitizer" or stored for future conversion in a digital memory. The primary function of a speech digitization system is the fabrication of phrases and sentences from a prestored vocabulary of selected words. This is readily accomplished with a digital system by selectively addressing appropriate memory locations in the digital word memory. Thus, it can be seen that speech digitization systems are ideally suited for applications desiring a human sounding voice and requiring only a limited vocabulary.

The restriction on vocabulary results primarily from the memory capacity required to digitally store an appreciable number of words. For example, assuming a system having eight bits of resolution and operating at a sample rate of 6000 times/second, a single one syllable word may require as many as 24,000 bits of storage. Accordingly, it can be readily appreciated that with conventional speech digitization systems, the storage of a substantial word vocabulary becomes prohibitive.

The present invention seeks to minimize these storage constraints by providing a speech digitization system that utilizes a minimum number of resolution bits without sacrificing the quality of the speech produced. In particular, the present invention is adapted to produce high quality human speech using as few as two bits of resolution. As will subsequently be described in greater detail, this is accomplished by providing a companded digitization system that maximizes the information content of each bit in the digital bit stream. This results in part from the inclusion of a novel amplitude function generator that is adapted to maintain substantial average duty cycles on all bits in the digital bit stream even at very low audio input levels. Consequently, the present invention is capable of producing speech quality comparable to systems having twice the number of resolution bits.

In a first embodiment of the present invention the filterd voice signal is provided to three comparator circuits; a polarity comparator, an upper limit comparator and a lower limit comparator. The polarity comparator circuit determines whether the signal is positive or negative. The upper and lower limit comparator circuits are adapted to compare the magnitude of the incoming vocal signal to a reference level that is varied in accordance with the amplitude function signal, which in turn is generated in accordance with the preceding duty cycle of the digital amplitude bit stream. In particular, as the percentage duty cycle of the digitized output signal increases, the magnitude of the amplitude function increases. Similarly, as the percentage duty cycle of the digital output signal decreases, the magnitude of the amplitude function also decreases. Thus, it will be seen that the reference levels of the upper and lower limit comparator circuits are expanded and compressed (i.e., "companded") in accordance with variations in the amplitude of the incoming vocal signal.

Significantly, it will additionally be seen that the novel manner in which the amplitude function signal is generated by the present invention greatly improves the signal-to-noise (S/N) ratio of the system by increasing the information content of the digital amplitude output signal at high and low audio input levels. Specifically, in the prefered embodiment of the present invention, the amplitude function signal is developed so as to maintain substantial duty cycles (i.e., around 50%) on the digital amplitude output signal.

In general, this is accomplished by averaging the digital amplitude output signal and providing the resulting analog signal to one of the inputs of a buffer amplifier circuit that has its other input connected to a bias network. The presence of the bias network serves to center the duty cycle spread of the digital amplitude output signal around 50%. More particularly, due to the closed loop feedback configuration of the system and the amplitude bias injection, the amplitude function produced at the output of the buffer amplitude circuit is maintained substantially around a 50% average duty cycle at the digital amplitude output. In addition, the gain of the buffer amplifier circuit is selected in the preferred embodiment so that the upper and lower duty cycle limits of the digital amplitude output signal will be approximately 40% and 60%. Thus, it will be seen that the duty cycle of the digital amplitude output signal is maintained within a range wherein its information content is statistically maximized.

In a second embodiment of the present invention, a system having four bits of resolution is disclosed that is capable of producing remarkable speech reproduction. In other words, the second embodiment produces a four-bit parallel digital output signal each time the vocal input signal is sampled, rather than a two-bit signal as in the first embodiment. The same type of amplitude function generator is utilized, however, to maximize the information content of the digital output. The amplitude function signal in this embodiment is provided to a multiplying digital-to-analog (D/A) converter that is adapted to convert the four-bit digital approximation signal to an analog signal which is then scaled in accordance with the amplitude function signal. The resulting signal is then provided to the reference input of a comparator circuit which has its other input connected to receive the sampled incoming audio signal. The comparator output is supplied to the input of a successive approximation register (SAR) that is adapted to produce a four-bit digital approximation of the sampled audio signal. The four-bit digital approximation is then latched through a quad latch buffer to produce the four-bit parallel digital amplitude output signal that is stored in memory.

Additional objects and advantages of the present invention will become apparent from a reading of the detailed description of the preferred embodiment which makes reference to the following set of drawings in which:

DETAILED DESCRIPTION OF THE PREFERRED EMBODIMENTS

Figure 1:
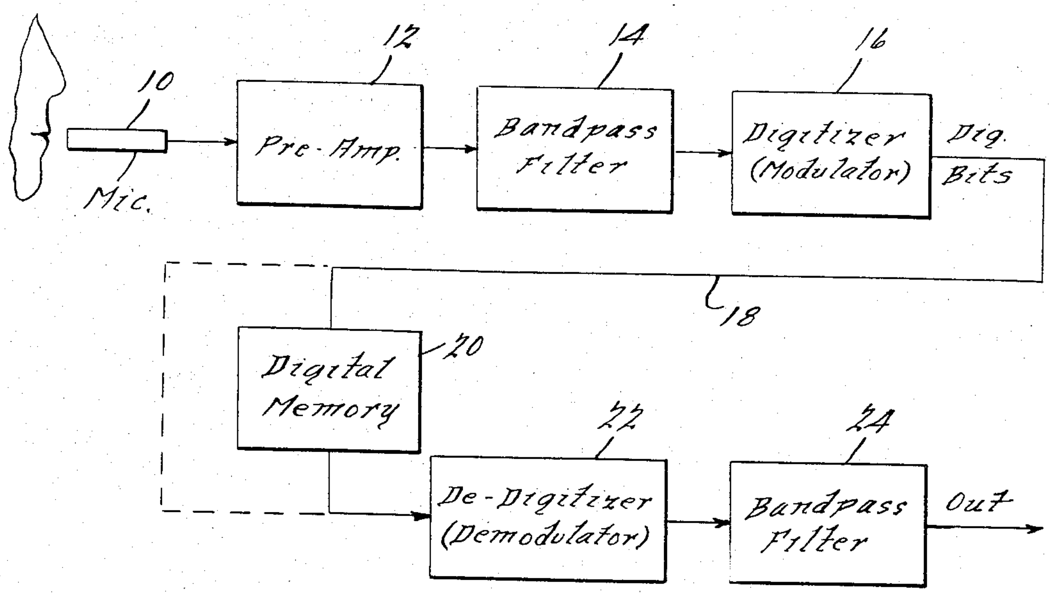
FIG. 1 is a general block diagram of a speech digitization system.

Referring to FIG. 1, a general block diagram of a speech digitization system is shown. Basically, the system comprises two separate components; the digitization system for generating a digital approximation of human speech and a de-digitization system for reconstructing the speech signal from the generated digital approximation. The digitization system includes in general a microphone 10 for converting the vocal sound to electrical energy, a preamplifier stage 12 for amplifying the signal to a workable magnitude level, a bandpass filter 14 for filtering extraneous signals outside the normal human vocal range, and a modulator or digitizer circuit 16 for generating a digital approximation of the audio input signal. The bandpass of the filter 14 is preferably selected to be 250–3000 Hz, with a sharp roll-off on both the high and low frequency ends. In the preferred embodiment herein a chebychev-type bandpass filter is utilized, however any appropriate bandpass filter having the aforementioned characteristics may be used. The digitizer circuit 16 in the preferred embodiments is adapted to sample the filtered speech signal 6000 times per second and generate at each sample point a parallel digital output signal approximating the speech signal sampled. In the first preferred embodiment, the digitizer 16 uses two bits of resolution. Accordingly, the digitizer 16 in the first embodiment has two parallel digital output lines 18. In the second preferred embodiment, the digitizer 16 employs four bits of resolution. Consequently, the digitizer 16 in the second embodiment has four parallel digital output lines 18. The digitizers 16 in both embodiments generate on each output line a digital bit stream which is either transmitted directly to the de-digitization system, or more commonly, stored in a digital memory 20 such as a read-only memory (ROM). Typically, the memory unit 20 will be used to store a vocabulary of selected words and/or phrases. The digitized speech information stored in memory unit 20 can then be used to fabricate a variety of desired speech messages by selectively addressing appropriate memory locations in the vocabulary memory 20.

In particular, the desired digitized speech information is read from the memory unit 20 and transferred to the de-digitization system which comprises a de-digitizer or demodulator 22 and another bandpass filter 24 similar to bandpass filter 14. The de-digitizer circuits 22 in the two preferred embodiments essentially represent the complements of the preferred digitizer circuits 16. Specifically, the de-digitizer circuit 16 in the first embodiment is adapted to reconstruct the digitized voice signal from two parallel digital bit streams of data, and the de-digitizer circuit 16 in the second embodiment is adapted to reconstruct the digitized voice signal from four parallel digital bit streams of data. The reconstructed speech signal is then filtered by bandpass filter 24 and ultimately converted back to sound energy by a speaker. Because speech digitization systems of the present type produce more natural sounding speech than a synthesizer, it can be seen that the present invention is particularly suited for applications requiring a natural sounding voice and a realtively limited vocabulary.

Figure 2:
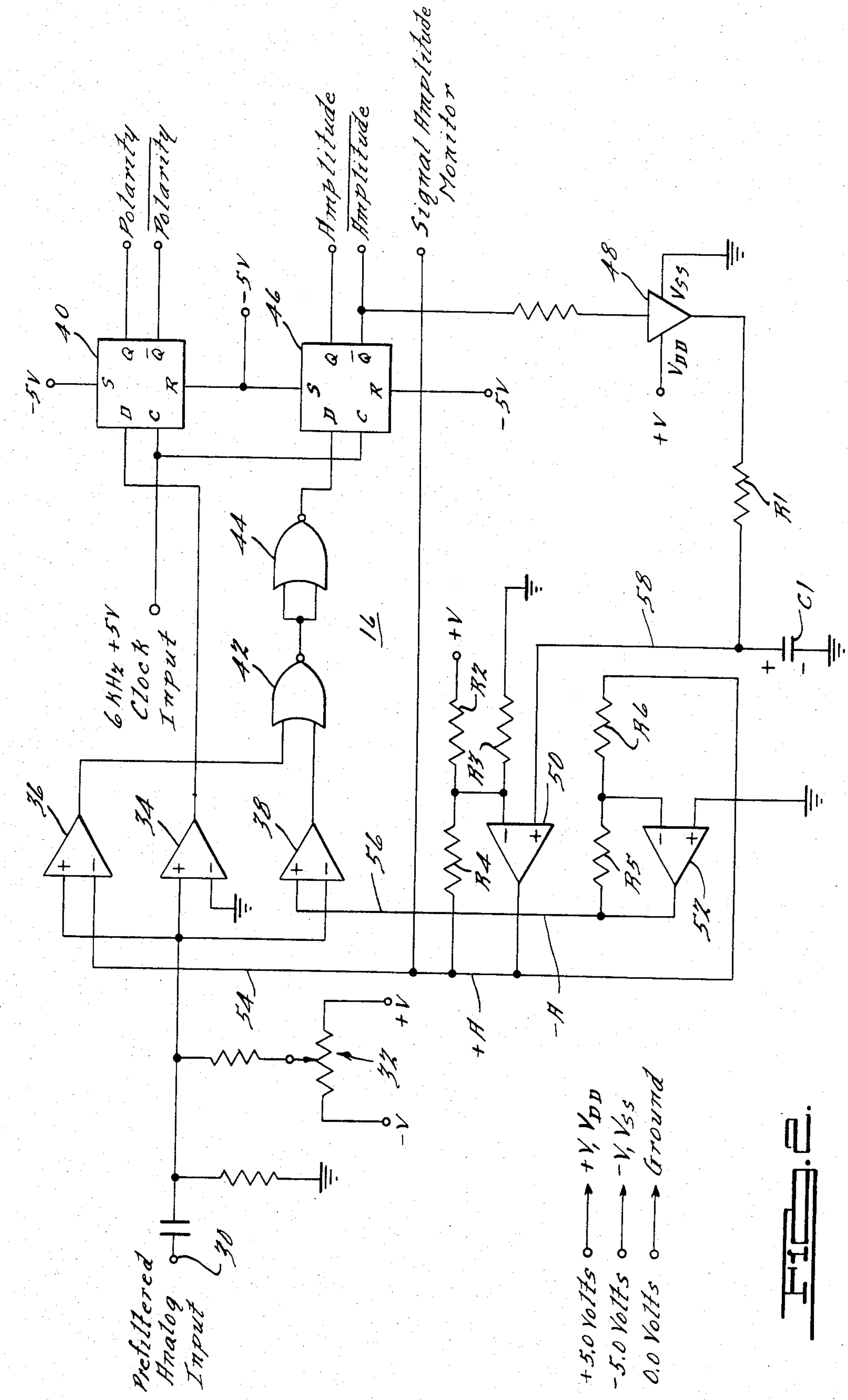
FIG. 2 is a circuit diagram of a first embodiment of a modulator or digitizer according to the present invention.

Looking now to FIG. 2, a circuit diagram of a first embodiment of a digitizer circuit 16 according to the present invention is shown. As previously noted, the digitizer circuit in the first embodiment utilizes two bits of resolution. One of the bits is designated as the sign bit and the other bit is designated as the amplitude bit. Accordingly, the digitizer circuit in FIG. 2 employs a type of "gray" code with the four levels being defined according to the following progression: 01, 00, 10 and 11, with 01 being the lowest level and 11 being the highest level. The left bit in this instance, is of course the sign bit and the right bit is the amplitude bit. In other words, the sign bit determines whether the audio signal is positive or negative and the amplitude bit determines whether magnitude of the audio signal is above or below an upper or lower limit, respectively.

Turning to the circuit diagram, the filtered speech signal is provided to the digitizer at input node 30. The signal is centered around zero volts by bias network 32 and provided to the inputs of three comparator amplifiers 34–38. Comparator amplifier 34 is a polarity comparator and comparator amplifiers 36 and 38 are upper limit and lower limit comparators, respectively. The analog speech signal is provided to the positive inputs of polarity comparator 34 and upper limit comparator 36, and to the inverting input of lower limit comparator 38.

Polarity comparator 34 is merely adapted to compare the analog speech signal to ground or zero potential to determine whether the signal is positive or negative. If the signal is positive, a HI signal will be produced at the output of polarity comparator 34. Conversely, if the signal is negative, a LO output signal will be produced. The output of polarity comparator 34 is provided to the data (D) input of a J-K flip-flop that is clocked at the 6 KHz. sample frequency. Accordingly, the signal at the Q output of flip-flop 40 comprises a digital square wave signal that switches from a HI state to a LO state in accordance with the polarity of the sampled speech signal. Specifically, when the polarity of the sampled speech signal is positive, the Q output of flip-flop 40 wil go HI for the sample period, and when the polarity of the sampled speech signal is negative, the Q output of flip-flop 40 will go LO for the sample period.

Returning to the upper limit and lower limit comparators 36 and 38 respectively, there is provided on line 54 to the negative input of upper limit comparator 36 and on line 56 to the positive input of lower limit comparator 38 the amplitude function reference signal (+A) and the inverted amplitude function reference signal (−A), respectively. The specific manner in which the amplitude function is generated will be described shortly in detail. Suffice for the moment to say that the magnitude of the amplitude function is varied in accordance with the magnitude of the incoming speech signal.

The upper limit comparator 36 is adapted to compare the incoming speech signal to the amplitude function signal (+A) on line 54 and provide a HI signal at its output when the magnitude of the speech signal is greater than the magnitude of the amplitude function signal. Conversely, when the magnitude of the speech signal is less than the magnitude of the amplitude function signal, a LO output signal is produced at the output of comparator 36.

Similarly, the lower limit comparator 38 is adapted to compare the incoming speech signal to the inverted amplitude function signal (−A) on line 56 and provide a HI output signal whenever the inverted magnitude of the speech signal is greater than the magnitude of the inverted amplitude function signal. Likewise, when the inverted magnitude of the speech signal is less than the magnitude of the inverted amplitude function signal, a LO output signal is produced at the output of comparator 38.

The outputs from the upper limit and lower limit comparators 36 and 38 are provided through an OR-gate equivalent comprised of a pair of NOR-gates 42 and 44 to the data (D) input of another J-K flip-flop 46. Flip-flop 46 is also clocked at the 6 KHz. sample frequency by the same clock signal that clocks flip-flop 40. Whenever either of the outputs from the upper limit and lower limit comparators 36 and 38 are HI, a HI signal will be present at the data input of flip-flop 46. (Note, that both of the outputs from comparators 36 and 38 cannot be HI at the same time.) On the other hand, if both the outputs from the upper and lower limit comparators 36 and 38 are LO, a LO signal will be present at the data input of flip-flop 46. Accordingly, it can be seen that the signal produced at the Q output of flip-flop 46 comprises a digital square wave signal having a duty cycle that is directly related to the relative absolute magnitude difference between the incoming speech signal and the amplitude function signal. The digital amplitude output signal from flip-flop 46 and the digital polarity output signal from flip-flop 40 comprise the parallel digital bit streams which are stored in the vocabulary memory for future speech reconstruction as previously described.

In order to provide a companded digitization system, the digital amplitude output signal is returned in a feedback loop to develop the amplitude function signal which controls the digitization process performed by the upper and lower limit comparators 36 and 38. Significantly, the present invention does not generate the amplitude function merely by averaging the digital amplitude output signal and applying the resulting analog signal to the reference inputs of the upper and lower limit comparators 36 and 38. Although such a system would be functional the duty cycle of the digital amplitude output signal in such a system would vary between 0% and approximately 80%, thus producing extremely poor signal-to-noise (S/N) ratios over much of the vocal amplitude range. The only practical way of compensating for such low S/N ratios would be to add more resolution bits.

Rather than expanding the bit-requirements of the system, however, the present invention resolves this problem by improving the information content of the digital bit stream by effectively maintaining the duty cycle of the digital output signal within a range of between 40% and 60%. This is highly desirable because the information content of a duty cycle signal is statistically maximized at 50%.

This is accomplished in the present invention by including within the feedback loop a buffer amplifier circuit having a bias network that effectively centers the duty cycle spread around 50%. In particular, the bi-polar square wave output signal from flip-flop 46 is provided through a CMOS buffer 48 which converts the ±5 volt signal to a unipolar 0–5 volt signal. The unipolar digital signal is then averaged by a filter circuit comprised of capacitor C1 and resistor R1. The filter circuit effectively converts the digital signal to an analog signal whose amplitude is directly related to the duty cycle of the digital square wave signal. In the preferred embodiment herein, resistor R1 is selected to be 20K and capacitor C1 is 10 mfd.

The converted analog signal on line 58 is then provided to the positive input of a buffer amplifier circuit comprised of operational amplifier 50, feedback resistor R4, and bias resistors R2 and R3. In the preferred embodiment, resistor R4 is 10K and resistors R2 and R3 are 5K each, thus providing buffer amplifier 50 with an effective gain of 5. For purposes of explanation, resistors R2 and R3 will be treated as a single 2.5K resistor connected to a 2.5 volt source; the Thevenin equivalent of the voltage divider arrangement shown. The output from buffer amplifier 50 comprises the amplitude function signal (+A) that is provided on line 54 to the negative input of upper limit comparator 36. In addition, the amplitude function signal on line 54 is provided through an inverting circuit comprised of op amp 52 and resistors R5 and R6 to the positive input of lower limit comparator 38. Accordingly, the signal on line 56 represents the inverted amplitude function signal (−A).

The voltage level of the amplitude function signal produced at the output of buffer amplifier 50 is determined according to the following formula:

$$V_{OUT} = (V_{pos.} - V_{neg.})\frac{R_f}{R_{in}} + V_{pos.}$$

$$= (V_{pos.} - 2.5)\frac{10K}{2.5K} + V_{pos.}$$

$$= 5V_{pos.} - 10$$

Thus, to determine the duty cycle spread of the digital amplitude output signal that will result from developing the amplitude function signal according to the above formula, the values of 5 v. and 0 v. are inserted for $V_{OUT}$ (the upper and lower voltage limits of the audio input signal), and the equation is solved for the corresponding values of $V_{pos.}$ In particular, for a zero voltage signal at the speech input 30, a 2 volt signal will result on line 58, which corresponds to a 40% (2/5) duty cycle signal at the Q output of flip-flop 46. Similarly, a 5 volt speech input signal will result in a 3 volt signal on line 58, which corresponds to a 60% (3/5) duty cycle digital amplitude signal.

Thus, it can be seen that as a result of the presence of the bias network connected to the negative input of buffer amplifier 50, the duty cycle spread of the digital amplitude output signal is centered around 50% as desired. In addition, the gain associated with the buffer circuit establishes the duty cycle spread of 40%–60%. To illustrate, if the gain of the circuit were reduced to 3 (by changing resistor R4 to 5K), the duty cycle spread of the digital output signal would be expanded to 33%–66%. Note, however, that as long as the bias network stays fixed at the values given, the duty cycle spread of the digital amplitude output signal will remain centered around 50%. In short, the bias network determines the center of duty cycle swing, and the gain of the feedback loop determines the spread. Thus, it can be seen that by varying the values of the buffer circuit components, any desired digital output signal characteristic can be obtained. However, as discussed previously, it is believed that the optimum results are obtained by centering the duty cycle swing around 50%. The "optimum" amount of gain, on the other hand, is less objectively determinable since an increase in gain, while restricting the duty cycle spread closer to 50%, also imposes an increased restraint on the preciseness of the circuit component values, and can even introduce a certain amount of "graininess" into the speech output if set too high. Accordingly, a lower feedback loop gain of 3 for example may be employed without significantly affecting the quality of the speech produced.

Figure 3:
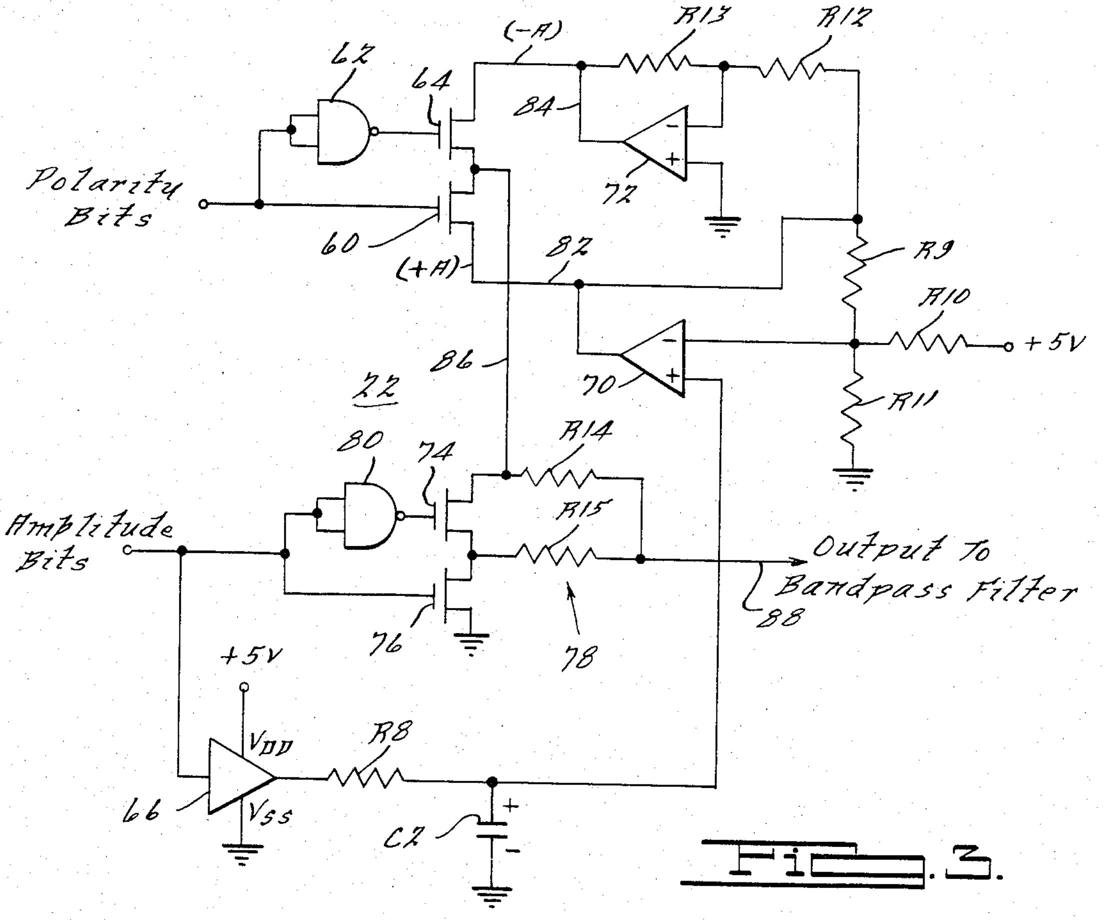
FIG. 3 is a circuit diagram of a first embodiment of a demodulator or de-digitizer according to the present invention.

Referring now to FIG. 3, a de-digitizer or demodulator circuit 22 for reconstructing the speech digitized by the modulator circuit 16 described in FIG. 2 is shown. The stream of digital polarity bits generated by the modulator circuit is provided to the control terminal of an analog gate 60 and through an inverter 62 to the control terminal of another analog gate 64. Consequently, it can be seen that either analog gate 60 or analog gate 64 will always be conducting at any given time, but never both at the same time. Analog gates 60 and 64 control the application of the reconstructed amplitude function (+A) and the inverted amplitude function (−A) to the D/A multiplier network 78, as will subsequently be described.

The amplitude function (+A) is reconstructed in the demodulator circuit by duplicating the feedback loop present in the modulator circuit. In particular, the amplitude bit stream is initially provided through a CMOS buffer 66, which converts the ±5 volt bi-polar digital signal to a 0–5 volt unipolar signal, and then through a filter circuit comprised of resistor R8 and capacitor C2 that is adapted to average the incoming digital amplitude signal. The values of resistor R8 and capacitor C2 are selected to match the values of resistor R1 and capacitor C1 in the modulator circuit of FIG. 2. The resulting analog signal on line 68 is provided to the positive input of buffer amplifier 70, which has its negative input connected to a bias network comprised of resistors R10 and R11, that is also balanced to match the bias network connected to the negative input of buffer amplifier 50 in the modulator circuit of FIG. 2. Feedback resistor R9 is likewise selected to be identical to feedback resistor R4 in FIG. 2 so that the gain in both circuits is the same. The output from buffer amplifier 70 provided to analog gate 60 comprises the amplitude function signal (+A). The amplitude function signal on line 82 is also provided through an inverting circuit, comprised of op amp 72 and resistors R12 and R13, to analog gate 64. Accordingly, the signal provided at the output of inverting amplifier 72 on line 84 comprises the inverted amplitude function signal (−A).

As noted previously, analog gates 60 and 64 control the application of the amplitude function signal (+A) on line 82 and the inverted amplitude fucntion signal (−A) on line 84 to the D/A multiplier network 78. The D/A multiplier 78, comprised of resistors R14 and R15 and analog gates 74 and 76, effectively re-converts the digital amplitude bit stream back to an analog signal in accordance with the amplitude function on line 86, which determines the proper polarity and provides the appropriate scaling factor. The value of resistor R14 is selected to be twice the value of resistor R15, herein 20K and 10K respectively. The control terminals of analog gates 74 and 76 are connected to the digital amplitude bit line, with the digital amplitude signal being provided to analog gate 74 through an inverter 80. Consequently, it can be seen that either analog gate 74 or analog gate 76 is always ON at any given time, but never both at the same time. The conductive states of analog gates 74 and 76 control the effect of multiplier circuit 78. Specifically, when analog gates 74 is ON and analog gates 76 is OF, the signal on line 86 will be multiplied by the greatest amount. Conversely, when analog gate 74 is OFF and analog gate 76 is ON, the signal on line 86 will be multiplied by the least amount. Thus, it can be seen that the analog output signal produced on line 88 comprises an approximated reconstruction of the speech signal digitized by the modulator circuit described in FIG. 2.

Figure 4:
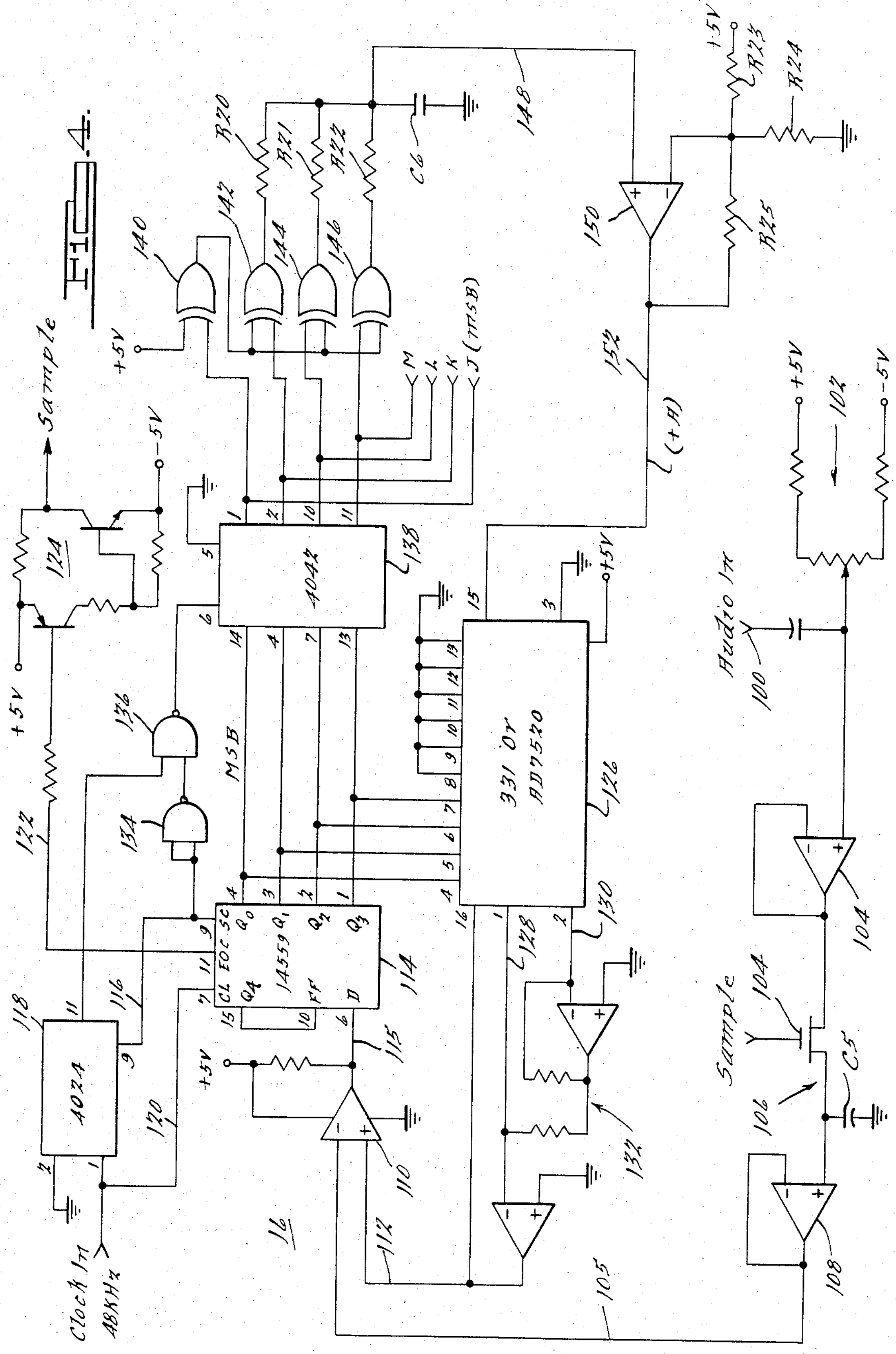
FIG. 4 is a circuit diagram of a second embodiment of a modulator or digitizer according to the present invention.

Looking now to FIG. 4, a circuit diagram of a second embodiment of a digitizer or modulator circuit 16 according to the present invention is shown. The digitizer illustrated in FIG. 4 is a four-bit speech encoder as opposed to a two-bit speech encoder as disclosed in FIG. 2. In other words, the digitizer circuit 16 shown in FIG. 4 generates a four-bit parallel digital output signal each time the incoming speech signal is sampled. However, as will be appreciated by those skilled in the art, the system design disclosed in the second embodiment herein is readily expandable to a larger number of resolution bits if such is desired.

The filter speech signal applied to input terminal 100 is provided through a signal bias network 102 that centers the speech signal around 0 volts and a unity gain buffer 104, to a sample-and-hold circuit 106 comprised of analog gate 104 and capacitor C5. The purpose of the same-and-hold circuit 106 will be subsequently described. The incoming speech signal is then provided through another unity gain buffer 108 to the negative input of a comparator amplifier 110. The signal on line 112 provided to the positive input of comparator amplifier 110 constitutes a scaled analog reference signal that is changed four times during each complete conversion process to permit the use of a single comparator 110 to perform all of the required comparison operations. This will also be described in greater detail subsequently.

The output of comparator amplifier 110 is provided to the input of a successive approximation register (SAR) 114. The successive approximation register 114 is adapted to produce a four-bit parallel digital output signal at output terminals $Q_0$–$Q_3$ (pins 1–4) in accordance with the successive condition of the output signal from comparator 110 on line 115. Specifically, when SAR 114 receives a "start conversion" pulse (SC) on line 116 from counter 118, SAR 114 looks to the signal on line 115. If it is HI, then the MSB (pin 4) is set to a one; if it is LO, then the MSB is set to a zero. Upon receipt of the next clock pulse on line 120 from the 48 KHz. clock signal, SAR 114 again examines the signal on line 115 and sets the next most significant bit (pin 3) accordingly. This procedure is similarly repeated for the least two significant bits (pins 1 and 2).

A predetermined period of time after the conversion is completed an "end of conversion" pulse (EOC) is generated on line 122. The 6 KHz. EOC signal on line 122 is provided to a level shifter circuit 124 that is adapted to convert the 0–5 volt unipolar signal to a ±5 volt bi-polar signal. The 6 KHz. sample signal generated thereby is then utilized to control the conductive condition of analog gate 104 to prevent the sampled speech signal on line 105 from changing during the course of the conversion process. In particular, analog gate 104 is momentarily rendered conductive by the sample signal 6,000 times each second, and capacitor C5 is adapted to "hold" the value of the sampled speech signal for the duration of each sample period. Hence, the second embodiment samples the incoming speech signal at the same 6 KHz. sample rate used in the first embodiment.

The four parallel digital output lines from SAR 114 are fed to a digital-to-analog converter 126 that is adapted to produce differential current output signals on lines 128 and 130 in accordance with the value of the four-bit parallel digital signal provided on its input. The differential current outputs on lines 128 and 130 are provided to a current-to-voltage conversion circuit 132 that is adapted to produce an analog voltage signal at its output on line 112 that is directly related to the current differential between the two signals on lines 128 and 130. Thus, it can be seen that the voltage level appearing on line 112 represents the analog equivalent of the four-bit digital signal provided to the input of D/A converter 126.

Ignoring for the moment the effect of the amplitude function signal on line 152, the details of the complete conversion process can now be explained. At the outset, the speech signal is sampled and "held" on line 105. The outputs ($Q_0$–$Q_3$) of SAR 114 are initially set to zero except for the MSB (pin 4) which is initially set to a "1". The initial digital output of SAR 114, when provided through D/A converter 126 and conversion circuit 132, results in a signal on line 112 equal to the analog equivalent of the digital number "1000" or 2.5 volts. (Assuming the signal on line 152 is initially equal to 5.0 volts). Comparator 110 then compares the sampled speech signal on line 105 with the 2.5 volts signal on line 112 and produces either a HI or LO output signal on line 115, depending upon whether the speech signal is greater than or less than the 2.5 volts reference signal on line 112. Upon receipt of the next clock pulse on line 120 from the 48 KHz. clock signal, SAR 114 sets the MSB (pin 4) in accordance with the state of the signal on line 115. At this point, the output of SAR 114 is equal to either "1000" or "0000" depending upon the result of the initial comparison. Assuming the MSB is set to zero, comparator 110 next compares the sampled speech signal to the analog equivalent of "0000" or zero volts and produces a corresponding output signal on line 115. Upon receipt of the next clock pulse on line 120, SAR 114 sets the next most significant bit (pin 3) accordingly. Assuming this bit is set to a one, comparator 110 then compares the sampled speech signal to the analog equivalent of "0100" or 1.25 volts and produces a corresponding output signal on line 115. Upon receipt of the next clock pulse on line 120, SAR 114 sets bit $Q_2$ (pin 2) accordingly. Finally, assuming this bit is also set to a one, comparator 110 compares the sampled speech signal to the analog equivalent of "0110" or 1.875 volts and produces a corresponding output signal on line 115. Upon receipt of the next clock pulse on line 120, SAR 114 sets the LSB (pin 1) accordingly. Thus, it can be seen that, after a period of approximately four clock pulses from the 48 KHz. clock signal, the complete four-bit digital approximation of the sampled speech signal is present on output lines $Q_0$–$Q_3$. Allowing for an additional brief period to permit the output lines from the SAR 114 to "settle", a clock pulse is then provided through NAND gates 134 and 136 to a quad latch buffer 138 which latches the digital approximation signal on its four output lines. The four-bit parallel output signal from latch 138 constitutes the digital amplitude output signal that is stored in the vocabulary memory.

The amplitude function signal (+A) in this embodiment is generated in substantially the same manner as in the embodiment illustrated in FIG. 2. In particular, the four-bit digital amplitude output signal from latch 138 is converted to an analog signal by a D/A converter circuit comprised of four exclusive-OR gates 140–146, weighting resistors R20–R22, and a capacitor C6. As will be readily understood by those skilled in the art, by utilizing straight binary coding (as opposed to the "gray" code used in the first embodiment), average amplitude information can be extracted from the digital output signal by exclusive-OR'ing the inverted MSB with each of the remaining three bits and combining the result by providing the outputs through weighting resistors R20–R22 and filter capacitor C6. The resulting signal on line 148 comprises the analog equivalent of the absolute value of the digital amplitude output signal.

The following truth table will assist in the understanding of the operation of this circuitry.

| OUTPUT OF LATCH 138 | OUTPUTS OF EXCLUSIVE-OR GATES 142–146 | VOLTAGE ON LINE 148 |
|---|---|---|
| 0000 | 111 | 5.00 |
| 0001 | 110 | 4.29 |
| 0010 | 101 | 3.57 |
| 0011 | 100 | 2.86 |
| 0100 | 011 | 2.14 |
| 0101 | 010 | 1.43 |
| 0110 | 001 | 0.71 |
| 0111 | 000 | 0.00 |
| 1000 | 000 | 0.00 |
| 1001 | 001 | 0.71 |
| 1010 | 010 | 1.43 |
| 1011 | 011 | 2.14 |
| 1100 | 100 | 2.86 |
| 1101 | 101 | 3.57 |
| 1110 | 110 | 4.29 |
| 1111 | 111 | 5.00 |

The analog signal on line 148 is provided to the positive input of buffer amplifier 150. The negative input of buffer amplifier 150 is connected to bias resistors R23 and R24 which in the preferred embodiment are 20K and 10K respectively. Accordingly, bias resistors R23 and R24 are equivalent to a single 6.7K resistor tied to a 1.67 volt source. Feedback resistor R25 in the preferred embodiment is selected to 20K, thus providing amplifier 150 with a gain of 4. As in the first embodiment of the digitizer illustrated in FIG. 2, the buffer amplifier 150 and bias network R23 and R24 are provided to insure that substantial duty cycles are maintained on the digital amplitude output even at very low audio input levels. Since the second embodiment has more than one amplitude bit, it is not essential that all of the output bits maintain substantial duty cycles at low input levels. However, it is important that the two least significant bits maintain substantial duty cycles at low input levels so that the signal-to-noise ratio of the system does not degenerate at low audio inputs.

In order to provide the companding function, the amplitude function signal (+A) on line 152 is provided to the multiplication input (pin 15) of the D/A converter 126. D/A converter 126 is adapted to multiply the differential current outputs on lines 128 and 130 by the signal present on line 152. Thus, the voltage output appearing on line 112 represents the analog equivalent of the four-bit digital signal provided to the input of D/A converter 126 times the amplitude function signal (+A) on line 152. Hence, the reference signal on line 112 against which the sampled speech signal on line 105 is compared is generated through a companded feedback loop as in the first embodiment.

Figure 5:
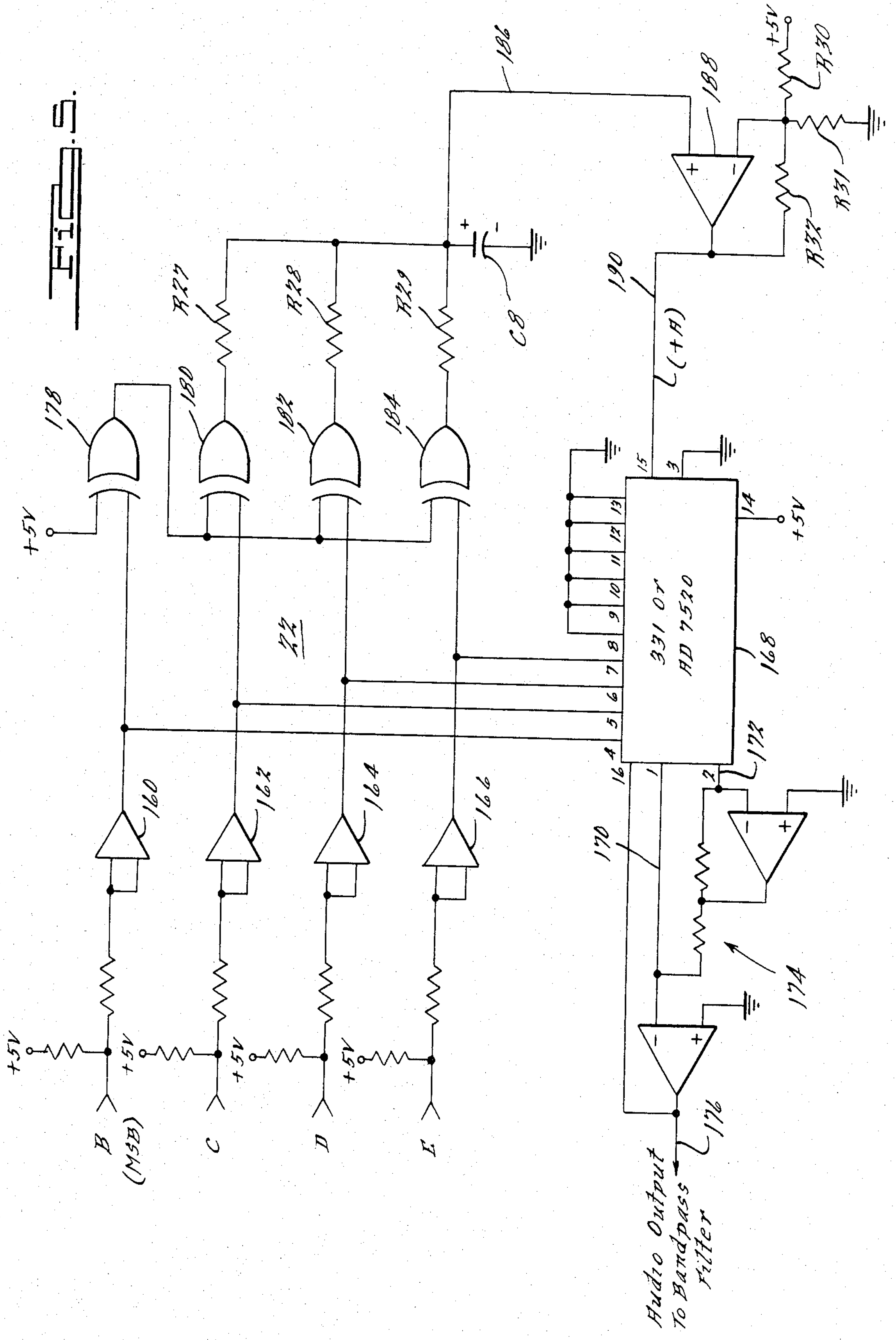
FIG. 5 is a circuit diagram of a second embodiment of a demodulator or de-digitizer according to the present invention.

Referring now to FIG. 5, the demodulator or de-digitizer circuit 22 for the second embodiment is shown. The four digital amplitude output bits are provided through CMOS buffers 160–166 in parallel to a D/A converter 169 similar to D/A converter 126 in the digitizer circuit in FIG. 4. As previously explained, D/A converter 168 is adapted to produce differential current output signals on lines 170 and 172 that are converted by a current-to-voltage converter network 174 to an analog voltage signal on line 176 that is directly related to the analog equivalent of the four-bit digital amplitude signal provided to the input of D/A converter 168. The multiplication factor supplied by the amplitude function signal (+A) on line 190 is reconstructed by duplicating the corresponding portion of the feedback network from the digitizer circuit. Specifically, the four-bit digital amplitude signal is converted back to its analog equivalent on line 186 by providing the amplitude bits through the exclusive-OR network 178–184 described previously and the filter circuit comprised of weighting resistors R27–R29 and capacitor C8. The resulting analog signal on line 186 is provided to the positive input of buffer amplifier 188 which has its negative input connected to bias resistors R30 and R31, which are identical to bias resistors R23 and R24 in FIG. 4. Similarly, feedback resistor R32 is the same value as feedback resistor R25 in FIG. 4 to provide buffer amplifier 188 with an identical gain factor of 4. Thus, it can be seen that the resulting amplitude function signal (+A) produced on line 190 is equivalent to the amplitude function signal generated on line 152 in the digitizer circuit in FIG. 4.

While the above description constitutes the preferred embodiments of the invention, it will be appreciated that the invention is susceptible to modification, variation and change without departing from the proper scope or fair meaning of the accompanying claims.

What is claimed is:

1. A de-digitizer for use in a companded speech digitization system including a digitizer circuit for generating a digital approximation of a bipolar analog audio input signal, the de-digitizer reconstructing the analog input signal from a pulse code modulated digital input signal representing a digital approximation of said analog waveform, including:

generator means responsive to said digital input signal for generating an amplitude function signal in accordance with said digital input signal, including first means for converting said digital input signal to a corresponding first analog signal, a bias network for producing a predetermined offset signal and an amplifier having associated therewith a predetermined gain greater than one and less than or equal to five and having said first analog signal connected to its positive input and said predetermined offset signal connected to its negative input;

decoder means for generating the analog input signal by multiplying said digital input signal with said amplitude function signal.

2. The de-digitizer of claim 1 wherein said encoded digital input signal comprises a two-bit parallel digital signal having a polarity bit and an amplitude bit; and said generator means further includes polarity means for setting the polarity of said amplitude function signal in accordance with said polarity bit signal.

3. The de-digitizer of claim 2 wherein said polarity means comprises an inverter for producing an inverted amplitude function signal, and first and second electronic switching devices connected to said amplitude function signal and said inverted amplitude function signal, respectively, for controlling the polarity of the amplitude function signal provided to said decoder means in accordance with said polarity bit signal.

4. The de-digitizer of claim 3 wherein said polarity means further comprises an inverter for producing an inverted polarity bit signal which is provided to the control terminal of said second electronic switching device and said polarity bit signal is provided to the control terminal of said first electronic switching device.

5. The de-digitizer of claim 2 wherein said decoder means comprises electronic switching means controlled by said amplitude bit signal and connected to a multiplicity of weighting resistors for controlling application of said amplitude function signal to said weighting resistors in accordance with said amplitude bit signal.

6. The de-digitizer of claim 5 wherein said decoder means comprises an inverter for producing an inverted amplitude bit signal, first and second electronic switching devices having control terminals connected to said amplitude bit signal and said inverted amplitude bit signal, and first and second weighting resistors connected to said first and second electronic switching devices; and amplitude function signal being provided to at least one of said first and second electronic switching devices.

7. The de-digitizer of claim 1 wherein said encoded digital input signal comprises an n-bit parallel digital signal having an MSB; and said first means comprises a logic gate for inverting said MSB, (n−1) exclusive-OR logic gates for logically comparing said inverted MSB to each of said remaining (n−1) bits in said n-bit digital signal, and filtering means for producing said first analog signal including (n−1) weighting resistors connected to the outputs of said exclusive-OR gates for combining said outputs and means for smoothing the abrupt variations in said combined signal.

8. The de-digitizer of claim 7 wherein said second means comprises an n-bit parallel digital-to-analog converter.

9. A de-digitizer for use in a companded speech digitization system including a digitizer circuit for generating a digital approximation of a bipolar analog audio input signal, the de-digitizer reconstructing the analog input signal from a pulse code modulated n-bit parallel digital input signal representing a digital approximation of said analog waveform, including:

a logic gate for inverting the most significant bit (MSB) from said n-bit parallel digital input signal, (n−1) exclusive-OR logic gates for logically comparing said inverted MSB to each of said remaining (n−1) bits in said n-bit digital signal, filter means for producing a first analog signal comprising (n−1) parallel-connected weighting resistors each connected to the output of one of said exclusive-OR gates and a capacitor connected between said weighting resistors and ground, a bias network for producing the predetermined offset signal, an amplifier having a predetermined gain greater than one and less than or equal to five and having said first analog signal connected to its positive input and said predetermined offset signal connected to its negative input, said amplifier producing said amplitude function signal at its output; and multiplying digital-to-analog conversion means having said n-bit digital input signal connected to its parallel digital input and said amplitude function signal connected to its multiplying input for generating said analog input signal by converting said n-bit digital input signal to a corresponding analog signal and scaling said analog signal in accordance with the magnitude of said amplitude function signal.

10. The de-digitizer of claim 9 wherein the voltage of said predetermined offset signal is approximately equal to the maximum voltage of said analog waveform divided by (n−1).

11. The de-digitizer of claim 10 wherein the gain of said amplifier is approximately equal to four.

* * * * *

UNITED STATES PATENT AND TRADEMARK OFFICE

CERTIFICATE OF CORRECTION

PATENT NO. : 4,532,495

DATED : July 30, 1985

INVENTOR(S) : Richard T. Gagnon

It is certified that error appears in the above-identified patent and that said Letters Patent is hereby corrected as shown below:

Column 1, line 57, "filterd" should be --filtered--.

Column 1, line 65, "preceeding" should be --percentage--.

Column 7, line 59, "fucntion" should be --function--.

Column 12, line 32, Claim 6, "and" should be --said--.

Signed and Sealed this

*Twenty-ninth* Day of *October 1985*

[SEAL]

*Attest:*

DONALD J. QUIGG

*Attesting Officer*

*Commissioner of Patents and Trademarks—Designate*